(12) United States Patent
Vuilloud et al.

(10) Patent No.: US 9,494,413 B2
(45) Date of Patent: Nov. 15, 2016

(54) PROBE HOLDER FOR MEASURING SYSTEM

(71) Applicant: TESA SA, Renens (CH)

(72) Inventors: Benjamin Vuilloud, Vufflens-la-Ville (CH); Julien Chardonnens, Bulle (CH);
(Continued)

(73) Assignee: TESA SA, Renens (CH)

( * ) Notice: Subject to any disclaimer, the term of this patent is extended or adjusted under 35 U.S.C. 154(b) by 132 days.

(21) Appl. No.: 14/658,010

(22) Filed: Mar. 13, 2015

(65) Prior Publication Data

US 2016/0025479 A1    Jan. 28, 2016

(30) Foreign Application Priority Data

Jul. 23, 2014  (EP) .................................... 14178218

(51) Int. Cl.
*G01R 1/02* (2006.01)
*G01B 11/00* (2006.01)
(Continued)

(52) U.S. Cl.
CPC ............. *G01B 11/005* (2013.01); *G01B 5/012* (2013.01); *G01B 7/012* (2013.01); *G01B 11/007* (2013.01);
(Continued)

(58) Field of Classification Search
CPC .................... G01R 1/04; G01R 1/0408; G01R 31/307; G01R 31/305; G01R 31/303;
(Continued)

(56) References Cited

U.S. PATENT DOCUMENTS 5,526,576 A * 6/1996 Fuchs .................... G01B 21/04
33/503
7,347,000 B2  3/2008 Jordil et al.
(Continued)

FOREIGN PATENT DOCUMENTS

EP    1 610 087 A1    12/2005
EP    1 963 781 B1     6/2010
(Continued)

OTHER PUBLICATIONS

Extended European Search Report dated Sep. 16, 2014 as received in Application No. 14178218.5.

*Primary Examiner* — Son Le
*Assistant Examiner* — Thang Le
(74) *Attorney, Agent, or Firm* — Maschoff Brennan

(57) ABSTRACT

Embodiments described in this disclosure include a probe holder for a measuring system comprising a first connector having electric and/or optical signal connections for attaching a measure probe, electric and/or optical conductor for connecting to the measure probe by first connector, a rotary actuator arranged to rotate the first connector relative to a reference system, an electric and/or optical slip ring and an angle encoder. The rotary actuator comprises a rotor capable of continuous rotation and an electric motor, while the angle encoder provides information on an angular position of the rotor. In some embodiments the rotor has a hollow axle supported by two coaxial spaced-apart bearings. The electric motor is located between the bearings, while the electric and/or optical conductor runs inside said hollow axle, and the electric and/or optical slip ring is in the hollow axle and between the bearings.

25 Claims, 5 Drawing Sheets

(72) Inventors: Léonard Wunderlin, Tolochenaz (CH); Claude Rouge, Baulmes (CH)

(51) Int. Cl.
*G01B 5/012* (2006.01)
*G01B 7/012* (2006.01)
*G01D 15/28* (2006.01)
*G01J 1/02* (2006.01)
*G01R 1/04* (2006.01)

(52) U.S. Cl.
CPC ............ *G01D 15/28* (2013.01); *G01J 1/0271* (2013.01); *G01R 1/0408* (2013.01)

(58) Field of Classification Search
CPC ............... G01R 31/302; G01R 31/265; G01R 31/311; G01R 31/2656; G01R 1/07342; G01R 1/06711; G01R 1/06738; G01R 1/06772; G01B 11/005; G01B 11/007; G01B 5/12; G01B 7/012; G01D 15/28; G01D 11/30; G01D 11/245

USPC ............... 324/754.01–754.2, 755.01–755.03, 324/149, 724, 690, 696; 73/661, 866.5
See application file for complete search history.

(56) References Cited

U.S. PATENT DOCUMENTS

| | | |
|---|---|---|
| 2006/0016086 A1 | 1/2006 | Raab et al. |
| 2010/0095542 A1* | 4/2010 | Ferrari ................... G01B 5/012 33/503 |
| 2010/0220369 A1 | 9/2010 | Knuttel |
| 2011/0270570 A1* | 11/2011 | Jordil ..................... G01B 5/012 702/150 |
| 2014/0101953 A1 | 4/2014 | Briggs et al. |

FOREIGN PATENT DOCUMENTS

| | | |
|---|---|---|
| EP | 2 384 851 A1 | 11/2011 |
| WO | 2007079837 A1 | 7/2007 |

\* cited by examiner

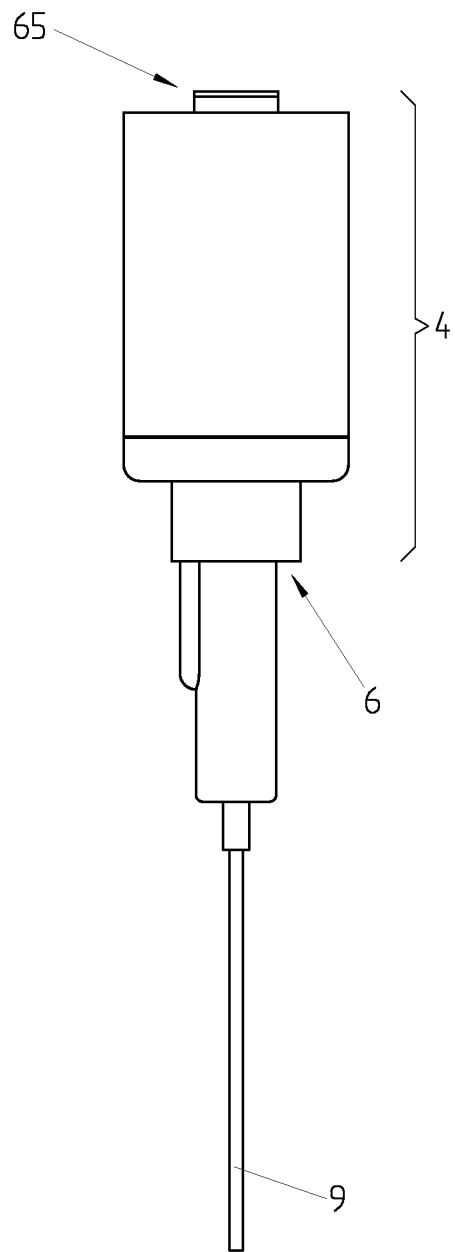
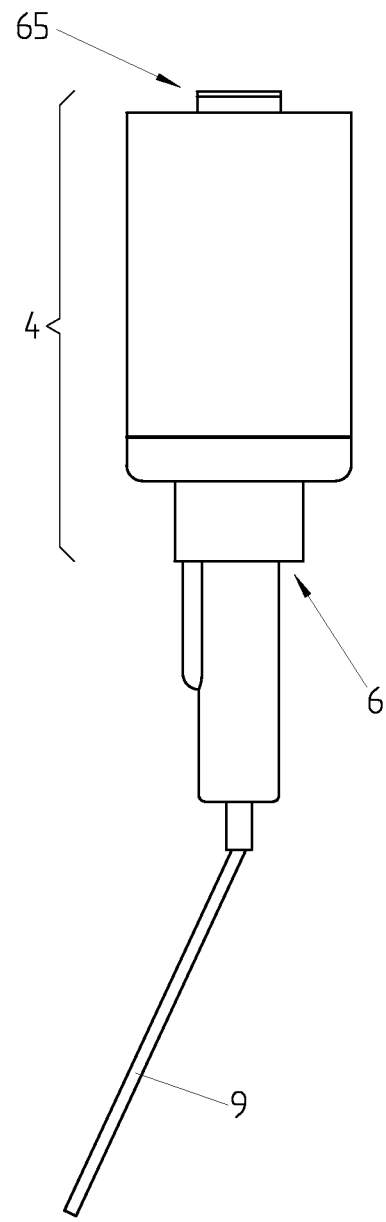
Fig. 5a                  Fig. 5b

PROBE HOLDER FOR MEASURING SYSTEM

CROSS REFERENCE

This application claims priority to European patent application no 14178218.5 filed on Jul. 23, 2014, which is incorporated herein by reference.

FIELD OF THE INVENTION

The embodiments of the present invention are broadly concerned with probe holder for measuring system, coordinate measure machines and methods of using coordinate measuring machines. These are devices for measuring coordinates of points at the surface of a workpiece as well as for scanning a surface of a workpiece along a scanning path, recording the coordinates of a series of points along the scanning path.

BACKGROUND

Coordinate Measuring Machines (CMM) are used in the art of dimensional metrology and are known in the art. In many cases the CMM comprises a reference surface, for example a rectified granite plane on which the workpieces to be measured can be placed, and a movable support that can be precisely positioned in the three coordinates XYZ by a suitable assembly of actuators and encoders.

Coordinate probe mounted on CMM could be a simple touch trigger probe, which determines the instant in time of the contact, as described, for example in EP1610087. In other cases, particularly when the surface is scanned with a probe in continuous contact, it is known to use a probe that determines the amount of deflection of the stylus in 3-D, for example by an LVDT or strain-gauge sensor, and transmits this deflection to the controller, to be integrated in the coordinate calculation.

Among the optical probes that can be used in CMM are micro-imaging digital systems, which are moved like the mechanical measuring probes, and are aimed at the point whose coordinates are to be measured, instead of touching the material, allowing 3-D coordinate measurements. Laser coordinate probes can likewise be used which are able to determine the coordinate of points on the surface of a measured object as they are illuminated by a scanning laser beam.

Coordinate measuring systems having a rotating adapter for measuring probes are known in the art. EP2384851 discloses a CMM comprising a moveable support and a modular rotational fitting arranged to interoperate between such moveable support and a probe connector. This modular rotational fitting comprises a plurality of electrical and optical signal connections and an actuator to turn the rotation fitting up to a predefined angle.

EP1963781 discloses a scanning system comprising a continuously rotating optical scan sensor. The scan probe comprises an optical slip ring that includes a fluid mounted light transport module in order to assure the transmission of optical signals between the scan sensor and the scanning system.

However, measurement systems of the prior art have limitations in selection of probes, in the static and dynamic geometrical errors, in the maximum scanning speed that can be achieved and, in many cases, they are unsuitable to continuously rotate contact and optical measuring probes around the rotational axis, without sacrificing coordinate precision. Known coordinate measuring systems suffer, at high scanning speed, of the vibrations generated by masses in rapid oscillatory movement. These vibrations are a source of measuring errors that are difficult to isolate and to quantify from the sampled points. Another limitation of the known coordinate measuring systems is an inability to offer a large selection of probes, including contact and optical probes, having different dimensions, in order to measure complex pieces. Moreover, the use of long and massive probes further increases the measuring error of such measuring systems.

US2011/270570 discloses a limited rotational probe support for CMM that could be modified to provide continuously rotations.

US2014/101953 and US2006/016086 disclose manually operated articulated arm CMM whose rotational segments and joints comprise optical and/or electrical slip rings.

SUMMARY

Some embodiments may eliminate or at least mitigate some of the problems of the prior art, in particular by providing a probe holder for measuring system, an articulated head and a measuring system adapted to continuously rotating a measuring probe around a rotational axis at high speed, with reduced vibrations and measuring errors.

Some embodiments may provide a probe holder for measuring system providing an enhanced static and dynamic angular accuracy as well as a reduced position error at the probe tip with respect to prior art.

Some embodiments may include a probe holder, the articulated head and the measuring system of appended claims.

In some embodiments, the probe holder for a measuring system may include a first connector comprising at least an electric and/or optical signal connection for attaching a measure probe at least an electric and/or optical conductor for connecting to the measure probe by the first connector; a second connector comprising at least an electric and/or optical signal connection for attaching to a coordinate measuring system; a rotary actuator arranged to rotate the first connector relative to a reference system, at least an electric and/or optical slip ring; an angle encoder providing information on an angular position of said rotor. In some embodiments the probe holder may be connectable to an articulated head of a measurement system. In some embodiments the rotary actuator may include a rotor capable of continuous rotation to which the first connector is attached and an electric motor. In some embodiments, the rotor has a hollow axle supported by two coaxial spaced-apart bearings, the electric motor is between the bearings, the electric and/or optical conductor(s) run(s) inside the hollow axle, and the electric and/or optical slip ring(s) is (are) in the hollow axle and between the bearings.

In some embodiments, the electric motor is a slotless brushless motor.

In some embodiments the motor is a brushless flat motor.

In some embodiments the motor is a piezo motor.

In some embodiments, the probe support further comprises a motor drive unit arranged for driving the electric motor with sinusoidal alternate current or currents.

In some embodiments, the rotary actuator comprises at least one temperature probe, an electrically controllable heat source, and a control circuit arranged for regulating a temperature of the actuator.

In an embodiment, the electric motor is operatively arranged to serve as the controllable heat source.

In some embodiments, the electric motor drives directly the rotor.

In some embodiments, the bearings include a fluid bearing, a fluid dynamic bearing, a hydrostatic bearing, an aerostatic bearing, an aerodynamic bearing and/or a magnetic levitation type bearing. For the purpose of the present application, it is intended that 'aerostatic bearing' encompasses any kind of bearing in which the a separation between journal surfaces is achieved by the static pressure in air or gas, while an 'aerodynamic bearing' relies on the dynamic pressure building in air or gas when said surfaces move relative to one another. Both aerostatic and aerodynamic bearing could also be designated as 'air bearings' or 'gas bearings'.

In some embodiments, the bearing has thrust-bearing surfaces separated by a film of pressurized fluid whose supply is selectively controllable such that these thrust-bearing surfaces can be put into contact, thereby increasing the friction of the bearing without modifying the rotation axis of the rotor.

In an embodiment, the thrust bearing surfaces are operatively arranged to be put into contact by means of increased pressure of pneumatic fluid.

In some embodiments, the probe holder further comprises magnetic attractive means to put into contact the thrust-bearing surfaces when the supply of pressurized fluid is reduced or shut off.

In an embodiment, a fluid supplying the fluid or air bearings cools, heats, controls and/or stabilizes the temperature of the rotary actuator, the motor, parts of the motor, and/or parts of the articulated head. Heating and/or cooling elements, e.g. Peltier elements, could be used to heat, to cool, to control and/or to stabilize the temperature of the fluid in order to cool, to heat, to controls and/or to stabilize the temperature of the rotary actuator, the motor, parts of the motor and/or parts of the articulated head. The temperature stabilization of—at least parts of—the articulated head regardless of motion states of its actuators could reduce measuring error caused by material thermal expansion.

In an embodiment, a fluid supplying the fluid or air bearings damps vibrations and/or reduces a propagation of vibrations that are generated and/or transmitted, in particular, by the probe, the rotor, the motor, parts of the articulated head and/or part of the measuring system. The vibrations damping or reduction could efficaciously reduce measuring errors.

In some embodiments, the bearings have rolling elements, in particular ceramic rolling, and/or angular contact elements In some embodiments, the first connector includes a passage for pneumatic fluids.

In some embodiments, the encoder is arranged to provide information on a positioning error of the rotor.

In some embodiments, the probe holder further comprises a second connector connectable to an articulated head of a measurement system.

In a preferred embodiment, the second connector is operatively arranged to be attached automatically and in a reproducible manner to the articulated probe head of the measure system.

In some embodiments, the probe holder is attached directly to the positioning platform without an intermediate articulated probe head.

In some embodiments, the second connector includes a passage for pneumatic fluids.

The invention further concerns an articulated head for a measuring system comprising the probe holder.

In some embodiments, the articulated head comprises a third connector connectable to a positioning platform of a measuring system.

In some embodiments, the third connector includes a passage for pneumatic fluids.

Some embodiments include one or more actuators, and an articulated head connected to a positioning platform. In some embodiments, the one or more actuators are arranged for positioning the positioning platform relative to the reference system.

In some embodiments, the measuring system is in combination with a scanning contact probe attached to the first connector, the scanning coordinate probe is arranged for determining coordinates of points on a surface of an object as they are touched by a feeler of the contact probe that slides along the surface. The scanning contact probe could sense in a direction that is substantially at 0°, 30°, 45°, 90° or at a variable angle with respect to the probe holder's axis of rotation. The scanning contact probe 9 could be of different lengths based on measure requirements.

In some embodiments, the measuring system is in combination with a laser coordinate probe attached to the first connector, the laser coordinate probe is arranged for determining coordinates of points on a surface of an object as they are illuminated by a scanning laser beam of the laser coordinate probe that sweeps the surface. The laser coordinate probe could have a plurality of laser beams. The measuring probe could be an optical probe with an optical beam at 0°, 30°, 45°, 90° or variable angle with respect to the probe holder's axis of rotation. The probe could be of different lengths based on measure requirements. The measuring probe could have multiple laser beams, each one oriented at a different angle with respect to the rotation axis of the probe holder.

In an embodiment, a microprocessor is provided in the probe holder, in the articulated head or in the measuring system.

In some embodiments, the articulated head or the measuring system further comprises a motor drive unit arranged for driving the electric motor with sinusoidal alternate current or currents.

In an embodiment, a fluid supplying the fluid or air bearings cools, heats, controls and/or to stabilizes the temperature of the rotary actuator, the motor, parts of the motor, parts of the articulated head and/or part of the measuring system. Heating and/or cooling elements, e.g. Peltier elements, could be used to heat, to cool, to control and/or to stabilize the temperature of the fluid in order to cool, to heat, to controls and/or to stabilize the temperature of the rotary actuator, the motor, parts of the motor, parts of the articulated head and/or part of the measuring system. The temperature stabilization of—at least parts of—the articulated head regardless of motion states of its actuators could reduce measuring error caused by material thermal expansion.

In an embodiment, a fluid supplying the fluid or air bearings damps vibrations and/or reduces a propagation of vibrations that are generated and/or transmitted, in particular, by the probe, the rotor, the motor, parts of the articulated head and/or part of the measuring system. The vibrations damping or reduction could efficaciously reduce measuring errors.

In a preferred embodiment, the axial distance between the bearings is at least 50 mm.

In a preferred embodiment, the electrical and optical slip rings are substantially on the rotational axis.

In an embodiment, the probe holder or the articulated head comprises an accelerometer.

Some embodiments include a measuring system that includes a positioning platform and one or more actuators for positioning the positioning platform relative to a reference system; an articulated head connected to said positioning platform having a probe connector comprising electric and/or optical signal connections for attaching a measure probe and electric and/or optical conductors for connecting to the measure probe by said probe connector; a rotary actuator in the articulated head arranged to rotate said probe connector relative to the reference system, the rotary actuator having a rotor capable of continuous rotation to which the probe connector is attached; an angle encoder providing information on an angular position of said rotor. In some embodiments, the rotor has an hollow axle supported by two coaxial spaced-apart bearings, the electric and/or optical conductors running inside said hollow axle.

BRIEF DESCRIPTION OF THE DRAWINGS

The invention will be better understood with the aid of the description of an embodiment given by way of example and illustrated by the figures, in which:

FIGS. 5a and 5b show a probe holder fitted with some probes.

DETAILED DESCRIPTION

Figure 1A:
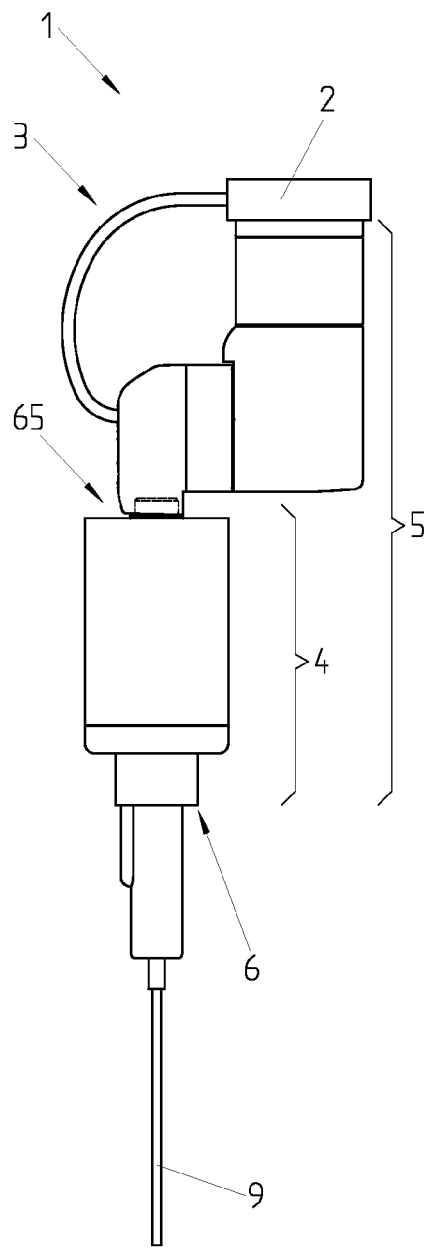
FIGS. 1a, 1b and 2 show an operational part of a measuring system comprising a probe holder fixed to an articulated head according to the invention.
Figure 1B:
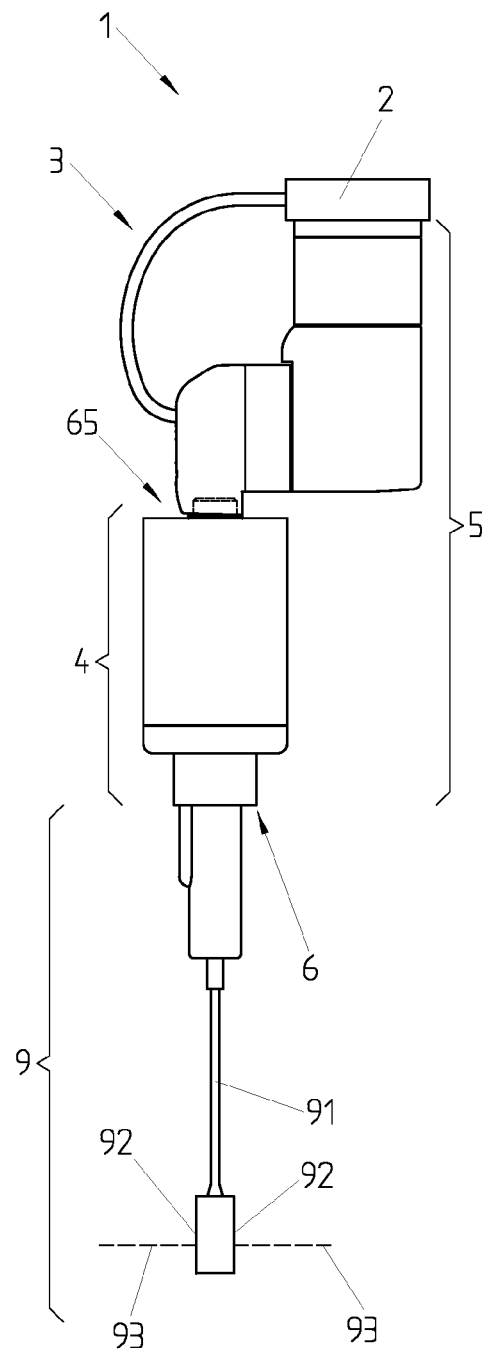

FIGS. 1a and 1b illustrate a measuring system 1 comprising an articulated head 5 connected to a positioning platform 2 that could be positioned relative to a reference system by one or more actuators. The articulated head 5 comprises a probe holder 4 having a first connector 6 for attaching a measure probe 9. The probe holder 4 is connectable to the articulated head 5, for example by means of a second connector 65 as illustrated by of FIGS. 1a and 1b. Alternatively, the probe holder 4 could be directly integrated into the articulated head 5 or fixed by known means to the articulated head 5. The measuring system 1 could comprise a plurality of articulated heads 5 and/or measuring probes 9, as showed in the example of FIG. 2.

The first connector 6 of the probe holder is adapted to offer a large selection of probes, including contact and optical probes having different dimension and sizes, in order to permit measurements of complex pieces.

The measuring probe 9 could be a contact probe arranged for determining coordinates of points on a surface of an object as they are touched by a feeler of the contact probe that slides along the surface.

The measuring probe 9 could be an optical probe with an optical beam at 0°, 30°, 45°, 90° or variable angle with respect to the probe holder's axis of rotation 30. The probe 9 could be of different lengths based on measure requirements. The optical probe could have multiple optical beams adapted, for example, to operate in frequency or time multiplexing to obtain star-shaped optical probe. The optical probe could be a bendable, endoscope-like probe tip, e.g. J-shaped stylus adapted to operate in constrained spaces.

The measuring probe 9 could be a triangulating laser (CMS) probe or, in alternative, it could be a 90° angle laser coordinate probe for determining coordinates of points on a surface of an object as they are illuminated by a scanning laser beam of the laser coordinate probe that sweeps the surface. The laser coordinate probe could comprise a plurality of laser beams.

FIG. 1b illustrates a measuring system 1 comprising a probe holder 4 whose first connector 6 supports an optical probe 91 comprising two opposite, radially-operating lasers probe 92. The lasers beams are perpendicular orientated respect to the rotational axis of the probe 91 (i.e. 90° angle oriented) and especially adapted to operate for "back-to-back" measurements. This optical probe permits to measure inside diameter of hollow objects ("back-to-back" measurements), while reducing measuring errors arising from probe wobble. A probe could have multiple laser beams, each one oriented at a different angle with respect to the rotation axis of the probe holder.

Figure 3:
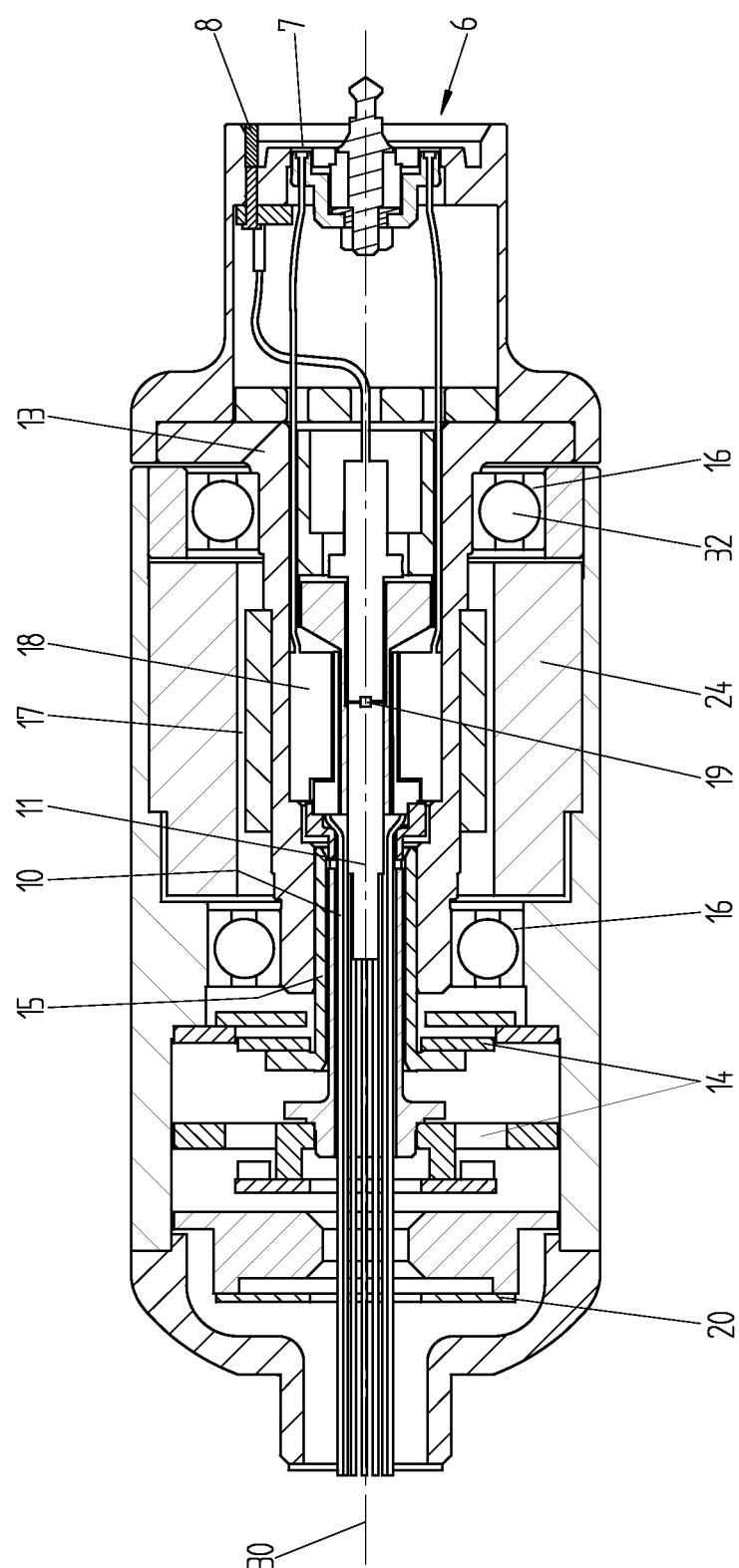
FIG. 3 illustrates a first embodiment of a probe holder for a coordinate measure machine, according to the invention.
Figure 4:
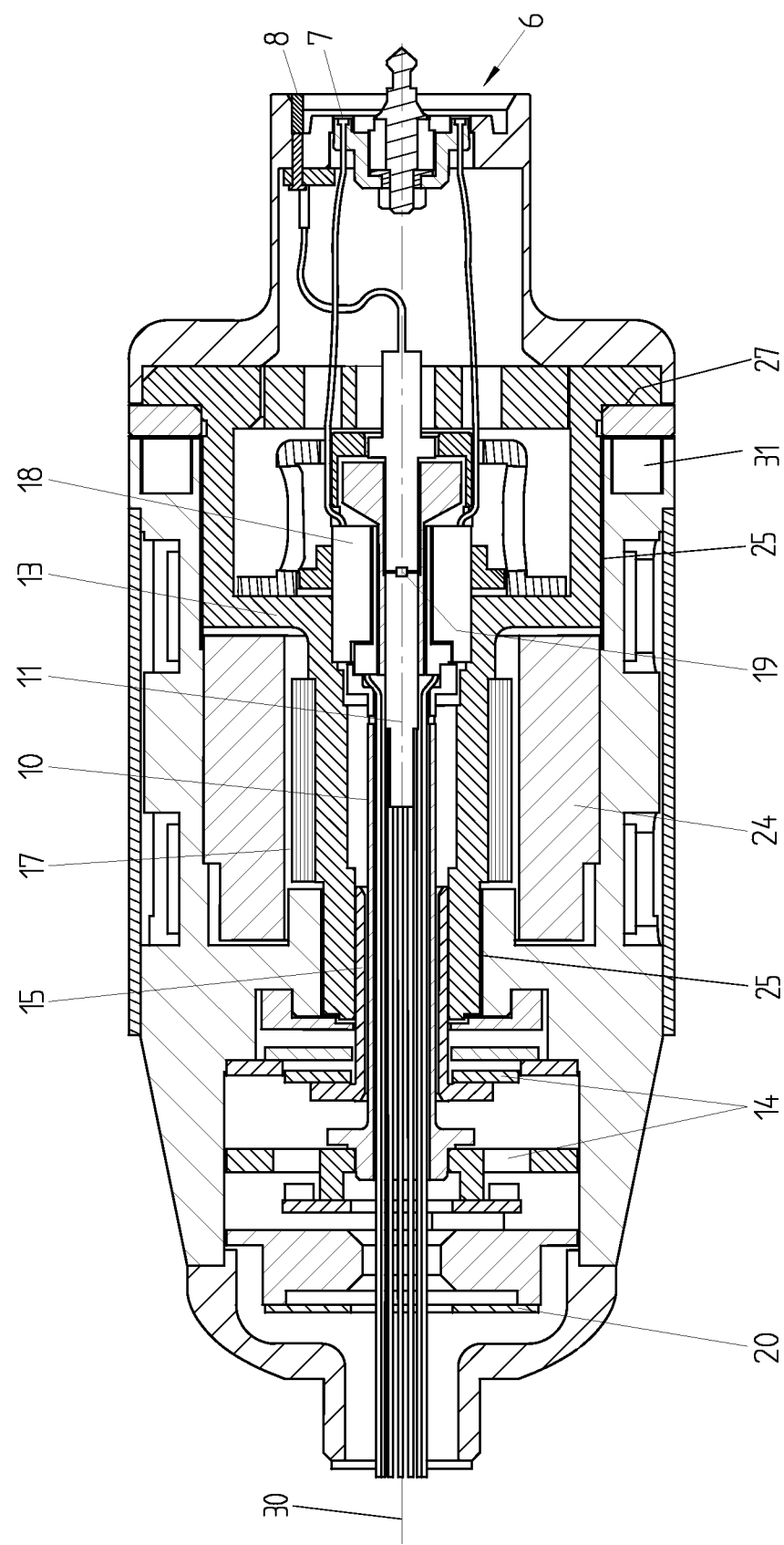
FIG. 4 illustrates a second embodiment of a probe holder for a coordinate measure machine, according to the invention.

In order to be able to attach a large selection of measuring probes 9, the probe holder 4 of the articulated head 5 comprises electric 10 and/or optical 11 conductors while the first connector 6 comprises electric 7 and/or optical 8 signal connections for connecting the measure probe 9, as illustrated in FIGS. 3 and 4. The first connector 6 could comprise a passage for pneumatic fluids required by the measuring probe 9 for measuring operations.

The connector 6 could be adapted for a modular attachment of a large selection of measurement probes.

Figure 2:
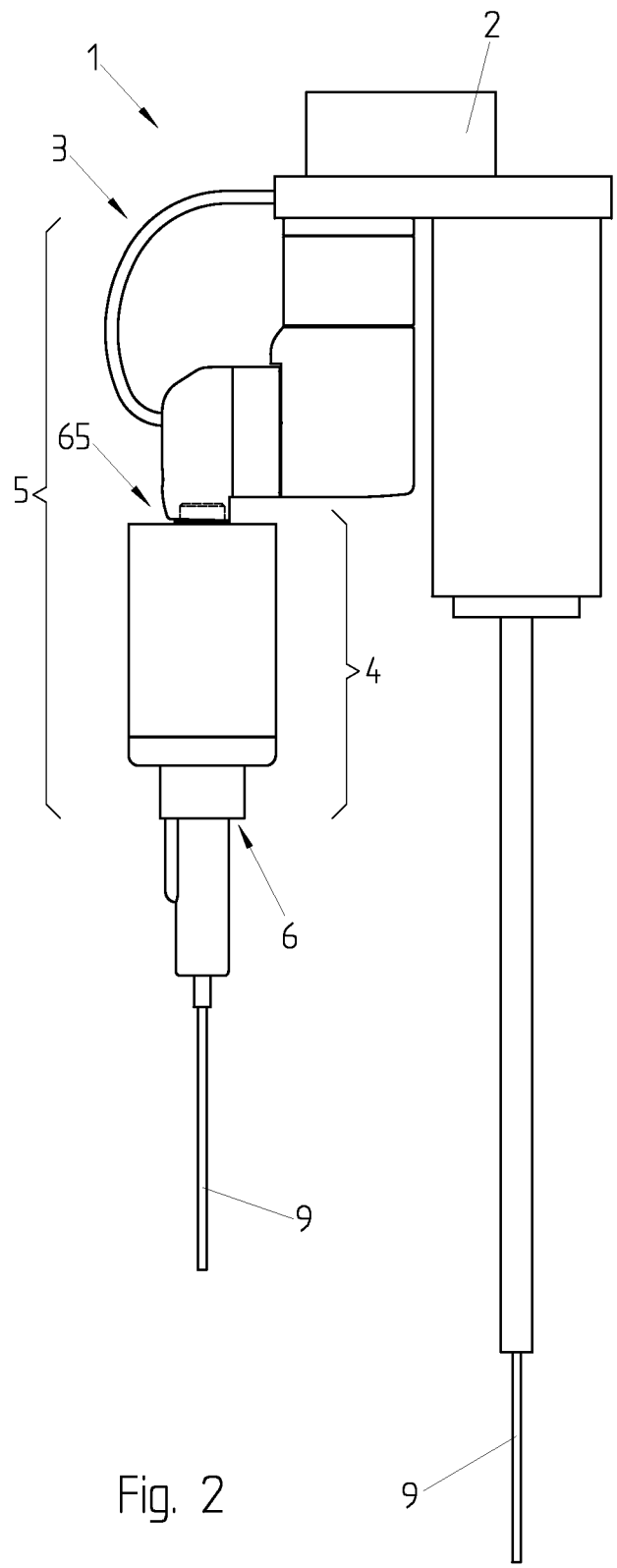

In FIGS. 1 and 2, the probe holder 4 is connected to an articulated head by mean of the second connector 65. The connector 65 could be adapted for a modular attachment to a large selection of articulated heads or parts of measuring systems. The connector could also be positioned on the side of the probe holder (4).

In order to offer various attaching arrangements, the second connector 65 could comprise a passage for pneumatic fluids required by the measuring probe 9 for measuring operations. The second connector 65 could comprise connectors for electric and/or optical signal connections required by the probe holder 4 itself and/or by the measuring probe 9 for measuring operations.

For the optical probes the laser beam could be transported from the external laser source (not shown) to the probe tip by means of optical conductors 3.

The optical and electrical conductors 3 could be completely or partially external to the articulated probe head 5, as shown in FIGS. 1a, 1b and 2, or they could be threaded internally. The second connector 65 could comprise optical connections for the optical probes.

The probe holder 4 of the articulated head 5 is arranged to rotate the first connector 6 relative to the reference system. A rotary actuator is thus comprised in the probe head for rotating the first connector 6. The rotary actuator has a rotor 13 capable of continuous rotation to which the first connector 6 is attached.

The angular position of the rotor is provided by an angle encoder 14.

The encoder 14 is further adapted to provide information on positioning errors of the rotor 13. The encoder provides additional analog data, such as signal amplitude, which can be used to measure and to compensate numerically the angular and geometrical errors of the encoder and rotor.

The rotor 13 has a hollow axle 15 supported by two coaxial spaced-apart bearings 16 while the electric 10 and optical 11 conductors run inside this hollow axle 15.

Preferably the axial distance between the bearings is at least 50 mm in order to assure sufficient stiffness and to reduce the geometrical errors at the probe tip.

The hollow axle could comprise electric 18 and/or optical 19 slip rings placed between said bearings 16 for assuring the transmission of needed signals between the measuring probe 9 and the measuring system 1 while permitting an unlimited rotation both clockwise and counter-clockwise of the measuring probe 9.

Advantageously, the disposition described above allows placing the electrical and optical slip rings 18, 19 on or very close to the rotational axis to assure reliable contact and to achieve a compact design.

The encoder device 14 is preferably affixed to a cantilevered section of the axle 15, beyond the upper bearing; in this manner, the diameter of the encoder's scale can be increased up to the limit imposed by the external dimensions, which allows the use of a scale with a finer gradation. The encoder 14, on the other hand, is advantageously placed close to the electronic interface circuit that is lodged in above the rotor.

This arrangement improves the stiffness and the compactness of the probe holder and of the articulated head while minimizing dimension and weight of such component.

The probe holder of articulated head 5 allows higher precision rotational measurements with respect to known systems. In particular, the mount of an optical probe with a substantially radially emitting beam(s) on the first connector 6 constitutes a more precise and rapid tool for fast measurement of boreholes, engines blocks, blades and other curved surfaces.

Data acquisition could be realized in point-to-point scanning mode, at constant angular velocity and/or at discrete position modes.

The rotary actuator comprises an electric motor 17 located between the bearings 16 that could drive directly the rotor 13. The probe holder or the articulated head 5 further comprises a motor drive unit 20 arranged for driving the electric motor 17.

In the embodiments of FIGS. 3 and 4, a brushless and frameless motor is used. In particular, the use of a slotless brushless motor with uniform magnetic field could assure non-cogging operations, clockwise and counter-clockwise operations as well as the rotor clamping when it is stopped.

The electric motor 17 is driven by a power motor drive unit that could either be included inside the probe holder or the articulated head itself or placed outside it. Preferably the motor drive unit is arranged to drive the motor 17 with variable-frequency sinusoidal excitation waveforms, in order to improve rotation smoothness, and uses the angular position delivered by the encoder 14 in order to control the motion of the motor 17 with exactness.

The motor drive unit preferably monitors the current drawn by the motor in order to detect if the motor's motion is blocked due to a collision.

Importantly, the motor drive unit allows motor operation down to zero rpm: the rotor can be stopped and maintained at any desired angular position.

The probe holder 4 or the articulated head 5 could be equipped with a microprocessor adapted to process encoder signals, data and/or information. The same processor could be in charge of the execution of other function required by the probe holder 4, the articulated head 5 and/or by the measurement system 1.

The microprocessor could drive the power motor drive unit. The microprocessor could read the encoder positions, processes the positions and drive the power motor drive unit accordingly in order to supply the drive current to the electrical motor 17.

A placement of a microprocessor inside the probe holder 4 or the articulated head 5 permits to dispose of dedicated data processing capacities while reducing resources (e.g. cables) required for data acquisition, data exchanging and for units driving.

Preferably the motor is selected to have low current at the required torque and to have low resistance in order to reduce the thermal dissipation. The low dissipation of the motor could stabilize the temperature of the probe holder (4) without requiring additional heating or cooling elements.

The probe holder 4 or the articulated head 5 could so be equipped with at least one temperature probe, an electrically controllable heat source and a regulating control circuit in order to regulate the temperature of the actuator, motor 17, parts of the probe holder 4 and/or part of the articulated head 5.

In a variant of the invention, the temperature of the motor could be derived in sensorless fashion by a measure of the electrical resistance of its windings; in this manner, the internal temperature of the probe holder 4, or parts whereof, could be determined and regulated without the need of a dedicated temperature probe.

Cooling elements, in particular Peltier elements, could be used both in open-loop or closed-loop arrangements to cool, to control and/or to stabilize the temperature of the motor 17, parts of the motor 17, parts of the probe holder 4 and/or parts of the articulated head 5.

Heating elements could be used to heat, to control and/or to stabilize the temperature of the motor 17, parts of the motor 17, parts of the probe holder 4 and/or parts of the articulated head 5. The motor could serve as a heating element.

The bearing 16 of the embodiment of FIG. 3 are ball bearings. Preferably, ball bearings have ceramic rolling elements 32 and/or angular contact bearings. When lower friction and higher stiffness are required, the device of the invention could be equipped with fluid bearings, air bearings, aerostatic bearings, aerodynamic bearings or magnetic levitation type bearings as shown in FIG. 4. This figure shows the probe holder of the articulated head 5 having two coaxial spaced-apart air bearings 25. Such air bearings 25 use a thin film of pressurized fluid to provide an essentially friction-free interface between the rotor 13 and the motor stator.

In the sense of the invention, fluid could be any gas (e.g. air) or liquid (e.g. water or oil) adapted to provide an essentially friction-free layer in a fluid bearing.

Preferably, one or both air bearings of this probe holder comprises thrust-bearing surfaces 27 separated by a film of pressurized fluid, which takes up the axial load applied to the rotor. In a preferred variant of the invention, the supply of such fluid to the thrust-bearing surfaces 27 is selectively controllable in order to put them into contact without modifying the rotation axis 30 of the rotor 13.

Attractive means, e.g. permanent magnets 31 or electromagnets, could be used to further increase the friction of the bearing by clamping the thrust-bearing surfaces 27 one against the other when the supply of such pressurized fluid is reduced or shut off. As a result, the rotor of the invention could be selectively braked or blocked in a fixed position when needed, by cutting off fluid supply to the thrust-bearing surfaces 27. This would permit a static positioning of the rotor that is more stable and insensitive to external influences than what can be achieved by the electric motor alone.

The fluid could be used to cool, to control and/or to stabilize the temperature of the motor 17, parts of the motor 17, parts of the probe holder 4 and/or parts of the articulated head 5.

Temperature of the fluid could be cooled and/or stabilized by cooling elements in order to cool, to control and/or to stabilize the temperature of the motor 17, parts of the motor 17, parts of the probe holder 4 and/or parts of the articulated head 5.

Temperature of the fluid could be cooled, heated and/or controlled by Peltier elements in order to cool, to heat, to control and/or to stabilize the temperature of the motor 17, parts of the motor 17, parts of the probe holder 4 and/or parts of the articulated head 5.

Temperature of the fluid could be heated and/or stabilized by heating elements in order to heat, to control and/or to stabilize the temperature of the motor 17, parts of the motor 17, parts of the probe holder 4 and/or parts of the articulated head 5.

The fluid could be used to damp vibrations that are generated and/or transmitted in particular by the probe 9, the rotor 13, the motor 17, parts of the probe holder 4, parts of the articulated head 5 and/or part of the measuring system 1.

The fluid could be used to reduce a propagation of vibrations generated and/or transmitted in particular by the probe 9, the rotor 13, the motor 17, parts of the probe holder 4, parts of the articulated head 5 and/or part of the measuring system 1.

The probe holder or the articulated head 5 could comprise an accelerometer. The accelerometer could be arranged in order to sense the angular orientation of the rotation axis 30 of the rotor 13 and/or of the axis of the probe 9 with respect to the vertical (i.e. respect to the direction of the gravity of Earth) and to provide an estimate of a gravitational deformation of part of the articulated head 5 and/or the probe holder 4 and/or the probe 9.

The accelerometer could be arranged in order to sense vibrations that could disturb the accuracy of the measurements. The vibrations could be generated and/or be transmitted in particular by the probe 9, the rotor 13, the motor 17, parts of the probe holder 4, parts of the articulated head 5 and/or part of the measuring system 1.

The microprocessor equipping the probe holder 4 or the articulated head 5 could provide an estimate of a gravitational deformation of part of the probe holder, part of the articulated head 5 and/or the probe 9 by processing the angular orientation provided by the accelerometer.

The microprocessor equipping the probe holder 4 or the articulated head 5 could provide an estimate of the accelerations and vibrations affecting the measurements in order to permit probe measurement corrections by processing the acceleration and vibration measurements provided by the accelerometer.

The microprocessor equipping the probe holder 4 or the articulated head 5 could use the temperature measured by the thermal probe and calculate the material thermal expansion in order to correct the measurements.

FIGS. 5a and 5b illustrate the probe holder 4 connected to a measuring probe 9 having a rotational or a symmetry axis at 0° (FIG. 5a) and at 30° (FIG. 5b) with respect to the rotational axis 30 of the probe holder 4. The measuring probe 9 could be an optical probe or a contact probe.

The probe holder 4 of FIGS. 5a and 5b could be a stand-alone device connectable to the articulated head 5 through the second connector 65, which could be arranged in order to provide an automatic and reproducible connection to the articulated probe head 5 of the measure system 1.

The second connector 65 could thus comprise a passage for pneumatic fluids required by the probe holder 4 and/or the measuring probe 9 for measuring operations. The second connector 65 could thus comprise connectors for electric and/or optical signal connections required by the probe holder and/or by the measuring probe 9 for measuring operations.

The articulated head 5 could be connectable to the measuring machine 1 through a third connector. The third connector could comprise a passage for pneumatic fluids required by the probe holder 4 and/or by the measuring probe 9 for measuring operations. The third connector could comprise connectors for electric and/or optical signal connections required by the articulated head 5, probe holder 4 and/or by the measuring probe 9 for measuring operations.

EXPERIMENTAL TEST

A test carried out on an example of the probe holder according to the invention has shown that it allows achieving very good angular setting accuracy of better than 2" while rotating at 200 rpm. At 200 rpm, the position accuracy of the probe tip at 150 mm distance from the probe connector 6 was shown to be at the submicron level. The static angular accuracy has been shown to be better than 1" with the probe holder at rest.

LIST OF ELEMENTS USED IN DRAWINGS

1 Measuring system
2 Positioning platform
3 Electrical/optical/fluid conductors
4 Probe holder
5 Head
6 Probe connector
65 Connector to attach to measuring system
7 Electric signal connection
8 Optical signal connection
9 Probe
91 Optical Probe
92 Laser beam
93 Laser beam direction
10 Electric conductor
11 Optical conductor
13 Rotor
14 Encoder
15 Hollow axle
16 Bearing
17 Electrical motor
18 Electric slip ring
19 Optical slip ring
20 Motor drive unit
24 Motor winding
25 Air bearing
27 Thrust-bearing surface
30 Rotational axis
31 Magnet
32 Ball bearing

What is claimed is:
1. A probe holder for a measuring system, comprising:
a first connector comprising electric and/or optical signal connections for attaching a measure probe electric and/or optical conductor for connecting to the measure probe by said first connector;
a rotary actuator arranged to rotate said first connector relative to a reference system, the rotary actuator com- prising a rotor capable of continuous rotation to which the first connector is attached and an electric motor;
an electric and/or optical slip ring; an angle encoder providing information on an angular position of said rotor;
wherein: the probe holder is connectable to an articulated head of a measurement system; wherein the rotor has a hollow axle supported by two coaxial spaced-apart bearings, the electric motor is between said bearings, the electric and/or optical conductor run inside said hollow axle, and the electric and/or optical slip ring are in the hollow axle and between said bearings.

2. The probe holder of claim 1, said electric motor being a slotless brushless motor.

3. The probe holder of claim 1, comprising a motor drive unit arranged for driving the electric motor with sinusoidal alternate current or currents.

4. The probe holder of claim 1, said actuator comprising at least one temperature probe and an electrically controllable heat source, and a control circuit arranged for regulating a temperature of said actuator.

5. The probe holder of claim 4, where the electric motor is operatively arranged to operate as the controllable heat source.

6. The probe holder of claim 1, wherein said electric motor drives directly said rotor.

7. The probe holder of claim 1, wherein said bearings include fluid bearings, aerostatical, aerodynamical or magnetic bearings.

8. The probe holder of claim 1, wherein at least one of said bearing has thrust-bearing surfaces separated by a film of pressurized fluid whose supply is selectively controllable such that said thrust-bearing surfaces can be put into contact, thereby increasing the friction of the bearing without modifying the rotation axis of the rotor.

9. The probe holder of claim 8, comprising magnetic attractive means to put into contact the thrust-bearing surfaces when the supply of pressurized fluid is reduced or shut off.

10. The probe holder of claim 8, wherein the thrust bearing surfaces are operatively arranged to be put into contact by means of increased pressure of pneumatic fluid.

11. The probe holder of claim 7, wherein a fluid supplying the bearings cools, heats, controls and/or to stabilizes the temperature of the motor, parts of the motor and/or parts of the probe holder.

12. The probe holder of one of claim 7, wherein a fluid supplying the bearings damps vibrations and/or reduces a propagation of vibrations that are generated and/or transmitted by the probe, the rotor, the motor and/or parts of the probe holder.

13. The probe holder of claim 1, wherein said bearings have rolling elements.

14. The probe holder of claim 1, wherein said first connector includes a passage for pneumatic fluids.

15. The probe holder of claim 1, further comprising a second connector comprising electric and/or optical signal connections for attachment to the articulated head of the measurement system or to parts of the measurement system.

16. The probe holder of claim 15, wherein said second connector includes a passage for pneumatic fluids.

17. The probe holder of claim 1, wherein the second connector is operatively arranged to be attached automatically and in a reproducible manner to the articulated probe head of the measure system.

18. The probe holder of claim 1, wherein said encoder provides information on a positioning error of said rotor.

19. An articulated head, comprising a probe holder for a measuring system, the probe holder comprising:
a first connector comprising electric and/or optical signal connections for attaching a measure probe electric and/or optical conductor for connecting to the measure probe by said first connector;
a rotary actuator arranged to rotate said first connector relative to a reference system, the rotary actuator comprising a rotor capable of continuous rotation to which the first connector is attached and an electric motor;
an electric and/or optical slip ring; and
an angle encoder providing information on an angular position of said rotor; wherein the probe holder is connectable to an articulated head of a measurement system;
wherein the rotor has a hollow axle supported by two coaxial spaced-apart bearings;
wherein the electric motor is between said bearings; the electric and/or optical conductor run inside said hollow axle; and
wherein the electric and/or optical slip ring are in the hollow axle and between said bearings.

20. The articulated head of claim 19, further comprising a third connector connectable to a positioning platform.

21. The articulated head of claim 19, wherein said third connector includes a passage for pneumatic fluids.

22. A measuring system comprising a positioning platform, one or more actuators, and a probe holder for a measuring system, the probe holder comprising:
a first connector comprising electric and/or optical signal connections for attaching a measure probe electric and/or optical conductor for connecting to the measure probe by said first connector;
a rotary actuator arranged to rotate said first connector relative to a reference system, the rotary actuator comprising a rotor capable of continuous rotation to which the first connector is attached and an electric motor;
an electric and/or optical slip ring; and
an angle encoder providing information on an angular position of said rotor;
wherein the probe holder is connectable to an articulated head of a measurement system;
the rotor has a hollow axle supported by two coaxial spaced-apart bearings;
wherein the electric motor is between said bearings;
wherein the electric and/or optical conductor run inside said hollow axle;
wherein the electric and/or optical slip ring are in the hollow axle and between said bearings, the articulated head being connected to said positioning platform; and
wherein the one or more actuators are arranged for positioning the positioning platform relative to the reference system.

23. The measuring system of claim 22, in combination with a scanning contact probe attached to said first connector, the scanning coordinate probe being arranged for determining coordinates of points on a surface of an object as they are touched by a feeler of the contact probe that slides along the surface.

24. The measuring system of claim 22, in combination with a laser coordinate probe attached to said first connector, the laser coordinate probe being arranged for determining coordinates of points on a surface of an object as they are illuminated by a scanning laser beam of the laser coordinate probe that sweeps the surface.

25. The measuring system of claim 22, wherein said laser coordinate probe has a plurality of laser beams.

* * * * *